United States Patent
Inoue

(10) Patent No.: US 10,212,843 B2
(45) Date of Patent: Feb. 19, 2019

(54) ELECTRONIC EQUIPMENT STAND

(71) Applicant: Sony Computer Entertainment Inc., Tokyo (JP)

(72) Inventor: Yukito Inoue, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 720 days.

(21) Appl. No.: 14/285,777

(22) Filed: May 23, 2014

(65) Prior Publication Data
US 2014/0364047 A1    Dec. 11, 2014

(30) Foreign Application Priority Data
Jun. 7, 2013   (JP) ................................ 2013-121341

(51) Int. Cl.
| | | |
|---|---|---|
| H05K 7/20 | (2006.01) | |
| F16M 11/04 | (2006.01) | |
| F16M 11/16 | (2006.01) | |
| G06F 1/16 | (2006.01) | |
| G06F 1/20 | (2006.01) | |
| F16M 11/22 | (2006.01) | |

(52) U.S. Cl.
CPC ....... *H05K 7/20009* (2013.01); *F16M 11/041* (2013.01); *F16M 11/16* (2013.01); *F16M 11/22* (2013.01); *G06F 1/1632* (2013.01); *G06F 1/203* (2013.01)

(58) Field of Classification Search
None
See application file for complete search history.

(56) References Cited

U.S. PATENT DOCUMENTS 3,021,149 A * 2/1962 Griffin ..................... G01N 3/04
                                                             279/123
5,664,793 A * 9/1997 Engibarov ........ B23B 31/16279
                                                             269/283

(Continued)

FOREIGN PATENT DOCUMENTS

| CN | 102679107 A | 9/2012 |
|----|-------------|--------|
| JP | 63-5693 A | 1/1888 |
| JP | 2011002899 A | 1/2011 |

OTHER PUBLICATIONS

Office Action for corresponding JP Application No. 2013-121341, dated Feb. 24, 2015.

(Continued)

*Primary Examiner* — Avinash A Savani
*Assistant Examiner* — Martha M Becton
(74) *Attorney, Agent, or Firm* — Matthew B. Dernier, Esq.

(57) ABSTRACT

Disclosed herein is a stand attachable to and detachable from an outer face of electronic equipment to support the electronic equipment, the stand including: an attachment face opposed to the outer face of the electronic equipment on which a ventilation section is provided; a first ventilation port formed on the attachment face and opposed to the ventilation section of the electronic equipment; a second ventilation port formed at a position different from the attachment face; an air channel formed inside the stand to connect the first and second ventilation ports; and an attachment section attached to the ventilation section of the electronic equipment to fasten the stand to the electronic equipment.

6 Claims, 6 Drawing Sheets

(56) References Cited

U.S. PATENT DOCUMENTS

| | | | | |
|---|---|---|---|---|
| 5,749,637 A * | 5/1998 | McMahan | A47B 91/00 | 220/629 |
| 6,259,601 B1 * | 7/2001 | Jaggers | G06F 1/203 | 165/104.33 |
| 6,439,528 B1 * | 8/2002 | Goto | F16M 11/00 | 211/43 |
| 6,522,535 B1 * | 2/2003 | Helot | G06F 1/203 | 165/104.34 |
| 6,626,709 B2 * | 9/2003 | Cisey | H01R 9/2408 | 439/701 |
| 6,837,058 B1 * | 1/2005 | McEuen | G06F 1/1626 | 361/679.41 |
| 7,134,635 B2 * | 11/2006 | Burriel | F16M 11/00 | 248/225.11 |
| 7,472,215 B1 * | 12/2008 | Mok | G06F 1/1632 | 710/304 |
| 7,480,141 B2 * | 1/2009 | Takenoshita | G06F 1/203 | 349/161 |
| 7,502,225 B2 * | 3/2009 | Solomon | G06F 1/1632 | 361/679.41 |
| 7,755,896 B2 | 7/2010 | Tamaki | | |
| 7,885,068 B2 * | 2/2011 | Seo | G06F 1/203 | 361/694 |
| 8,811,018 B2 * | 8/2014 | Ikeda | G06F 1/20 | 165/104.33 |
| 8,926,414 B1 * | 1/2015 | Kirkpatrick | H05K 7/20136 | 361/679.41 |
| 9,059,146 B2 * | 6/2015 | Inoue | G06F 1/20 | |
| 9,436,238 B1 * | 9/2016 | Douthit | H05K 7/20127 | |
| 2002/0141152 A1 * | 10/2002 | Pokharna | G06F 1/1632 | 361/679.41 |
| 2004/0261422 A1 * | 12/2004 | McEuen | G06F 1/1626 | 62/3.2 |
| 2006/0120037 A1 * | 6/2006 | DeLuga | G06F 1/1632 | 361/690 |
| 2006/0262497 A1 * | 11/2006 | Jahlokov | F16M 13/00 | 361/679.41 |
| 2009/0034188 A1 * | 2/2009 | Sween | G06F 1/203 | 361/679.49 |
| 2009/0180253 A1 * | 7/2009 | Chang | G06F 1/1632 | 361/695 |
| 2009/0323275 A1 * | 12/2009 | Rehmann | G06F 1/1632 | 361/679.48 |
| 2010/0046169 A1 * | 2/2010 | Hu | G06F 1/1632 | 361/707 |
| 2010/0050907 A1 * | 3/2010 | Wu | F16M 11/10 | 108/9 |
| 2010/0079945 A1 * | 4/2010 | Wang | G06F 1/1632 | 361/695 |
| 2010/0133397 A1 * | 6/2010 | Hu | F16M 13/00 | 248/176.1 |
| 2010/0134976 A1 * | 6/2010 | Kuo | G06F 1/1632 | 361/695 |
| 2010/0219729 A1 * | 9/2010 | Huang | G06F 1/1632 | 312/330.1 |
| 2010/0226088 A1 * | 9/2010 | Huang | G06F 1/203 | 361/679.48 |
| 2011/0200219 A1 * | 8/2011 | Vizcarra | G06F 1/1632 | 381/332 |
| 2012/0194993 A1 | 8/2012 | Oguchi | | |
| 2012/0327581 A1 * | 12/2012 | Pais | G06F 1/1632 | 361/679.26 |
| 2013/0148833 A1 * | 6/2013 | Endo | G06F 1/206 | 381/332 |
| 2014/0209282 A1 * | 7/2014 | Chao | G06F 1/16 | 165/121 |

OTHER PUBLICATIONS

Office Action for corresponding CN Application No. 201410238552.6, 16 pages, dated Jun. 29, 2016.

Office Action for corresponding EP Application No. 14001847.4-1959, dated Jun. 24, 2015.

European Search Report for corresponding EP Application No. 14001847, dated Aug. 26, 2014.

* cited by examiner

ELECTRONIC EQUIPMENT STAND

BACKGROUND

The present disclosure relates to an electronic equipment stand, and more particularly, to a technology for minimizing the reduction in ventilation efficiency when a stand is attached to electronic equipment.

U.S. Pat. No. 7,755,896 (hereinafter referred to as Patent Document 1) discloses electronic equipment provided on the side face of an enclosure whose intake section includes a plurality of intake holes. This electronic equipment sucks in outside air through the intake holes and cools the integrated circuits mounted to the circuit board with the sucked air by driving a cooling fan.

SUMMARY

Some pieces of electronic equipment have a stand attached to their side faces and are installed in portrait orientation in such a manner as to be laid on the side faces. However, if the intake section is provided on the side face as in the case of the electronic equipment disclosed in Patent Document 1, attaching a stand leads to lower ventilation efficiency.

It is desirable to provide an electronic equipment stand that can minimize the reduction in ventilation efficiency.

According to an embodiment of the present disclosure, there is provided a stand attachable to and detachable from an outer face of electronic equipment to support the electronic equipment. The stand includes an attachment face, first and second ventilation ports, an air channel, and an attachment section. The attachment face is opposed to the outer face of the electronic equipment on which a ventilation section is provided. The first ventilation port is formed on the attachment face and opposed to the ventilation section of the electronic equipment. The second ventilation port is formed at a position different from the attachment face. The air channel is formed inside the stand and connects the first and second ventilation ports. The attachment section is attached to the ventilation section of the electronic equipment and fastens the stand to the electronic equipment. The present disclosure can minimize the reduction in ventilation efficiency when the stand is attached to the electronic equipment. Further, because the attachment section is attached to the ventilation section of the electronic equipment, it is possible to minimize the upsizing of the stand as compared, for example, to if an attachment section is provided on the stand, and if the attachment section entirely surrounds the face on which the stand is provided.

DETAILED DESCRIPTION OF THE PREFERRED EMBODIMENT

Figure 1:
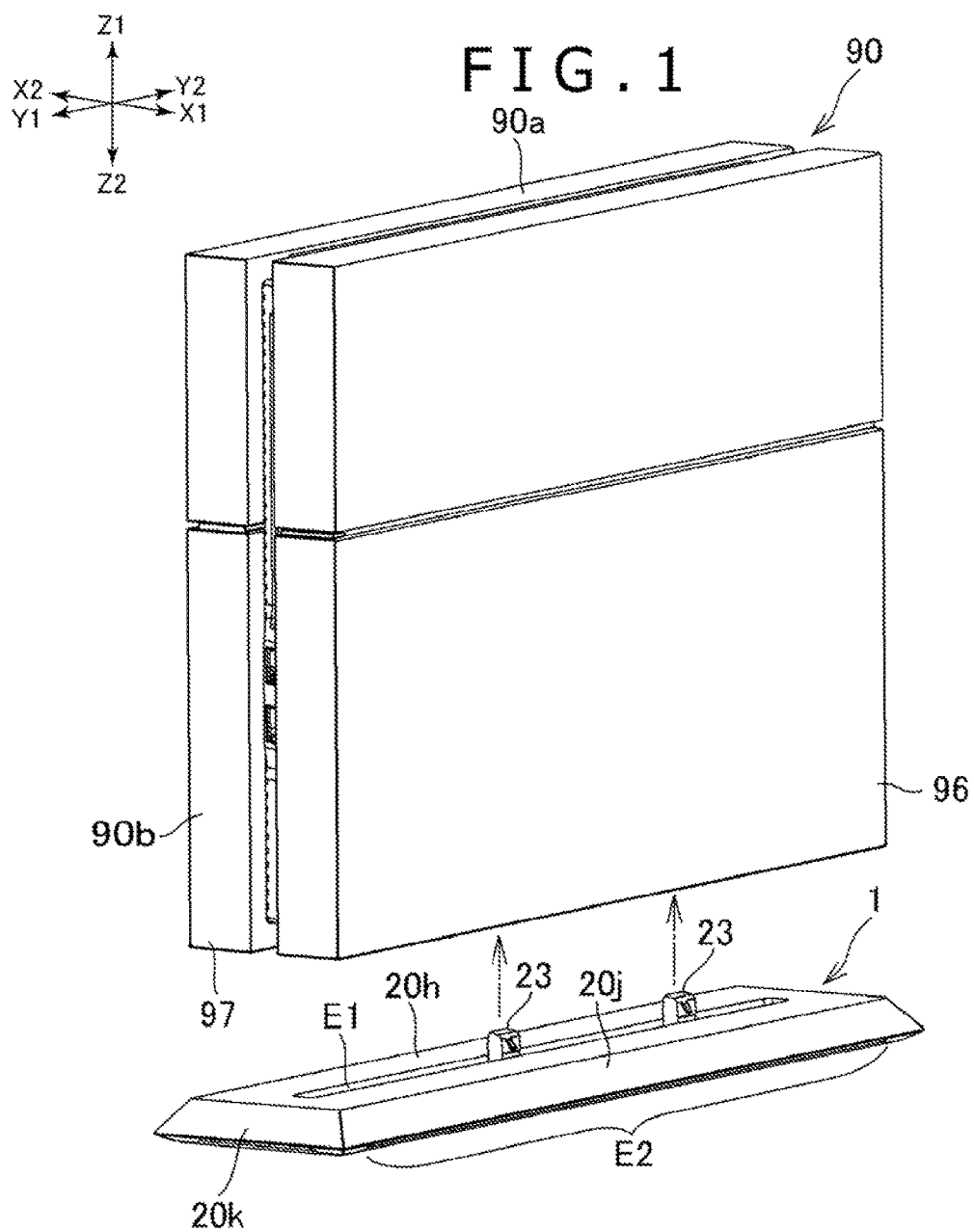
FIG. 1 is a perspective view of a stand and electronic equipment according to an embodiment of the present disclosure.
Figure 2:
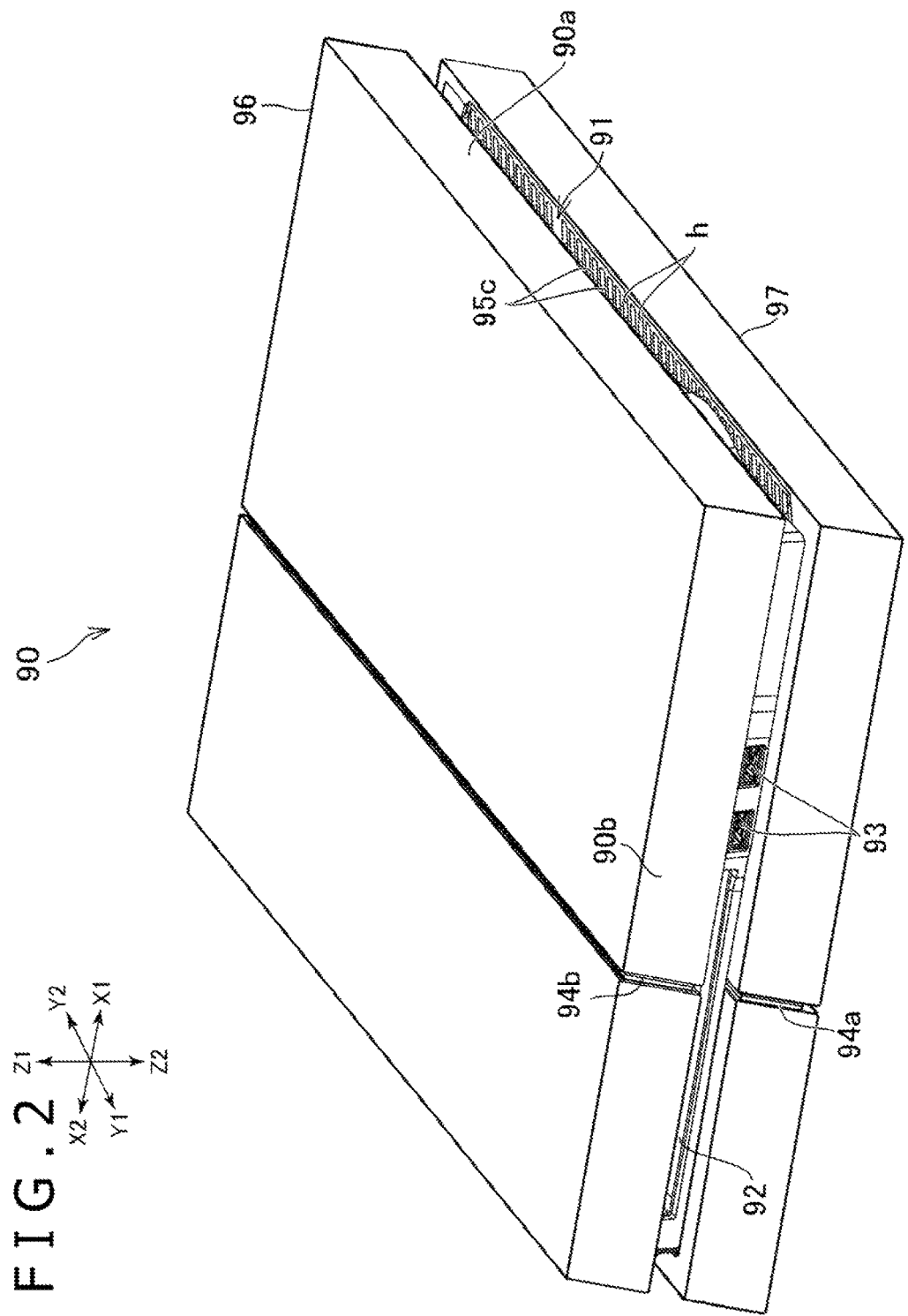
FIG. 2 is a perspective view of the electronic equipment which is arranged in landscape orientation.
Figure 3:
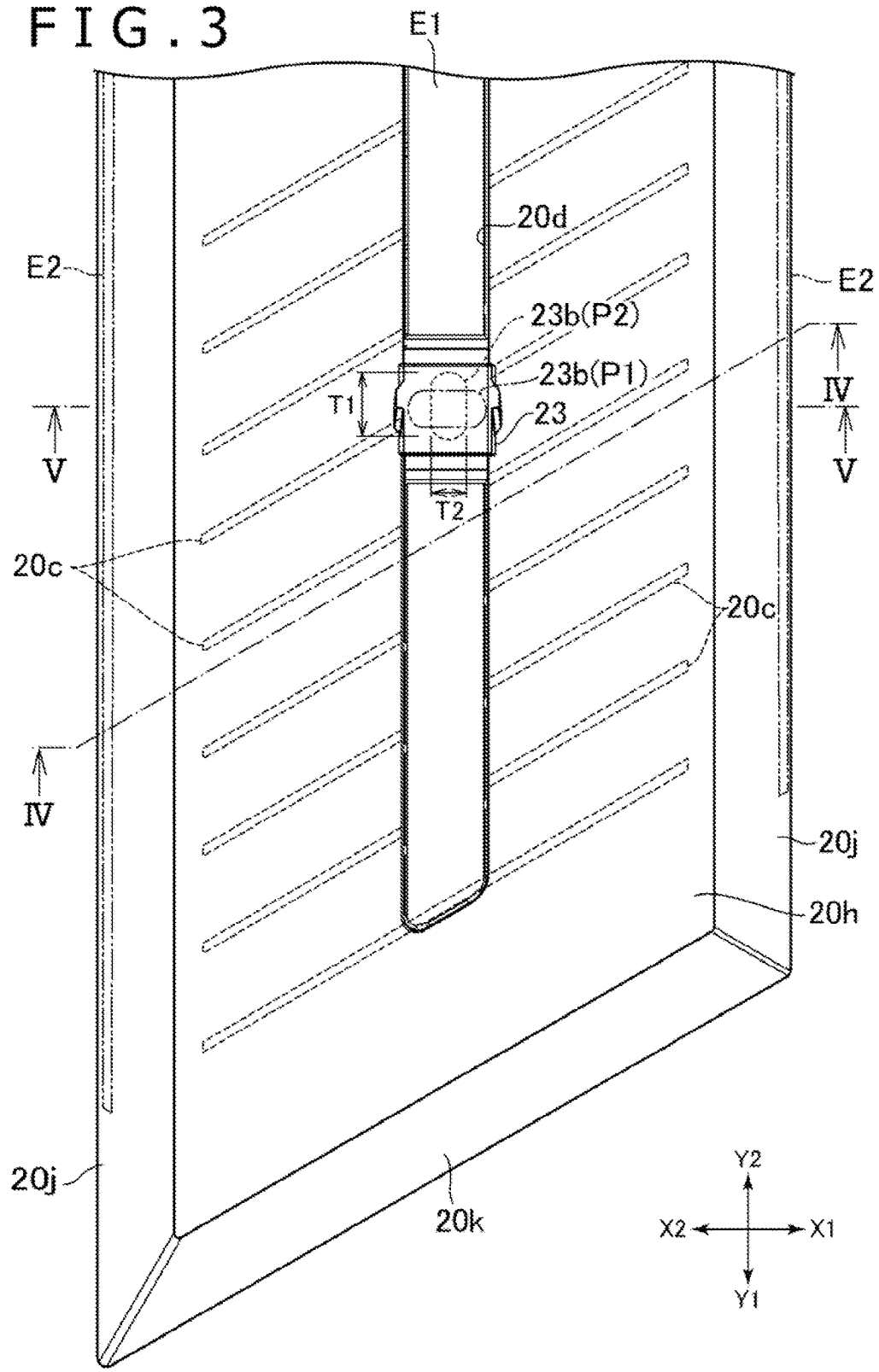
FIG. 3 is a plan view of the stand.
Figure 4:
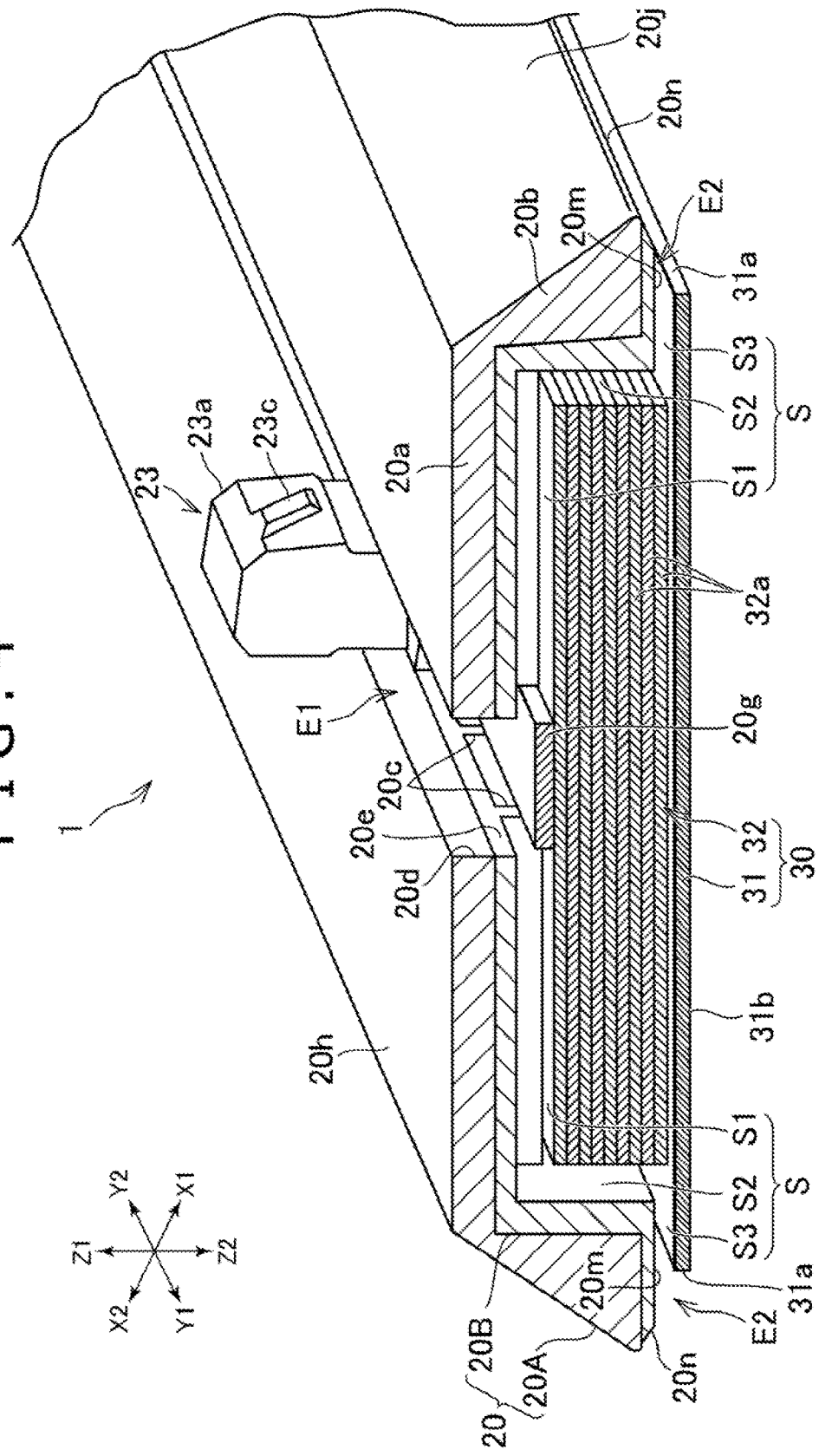
FIG. 4 is a cross-sectional view along line IV-IV in FIG. 3.
Figure 5:
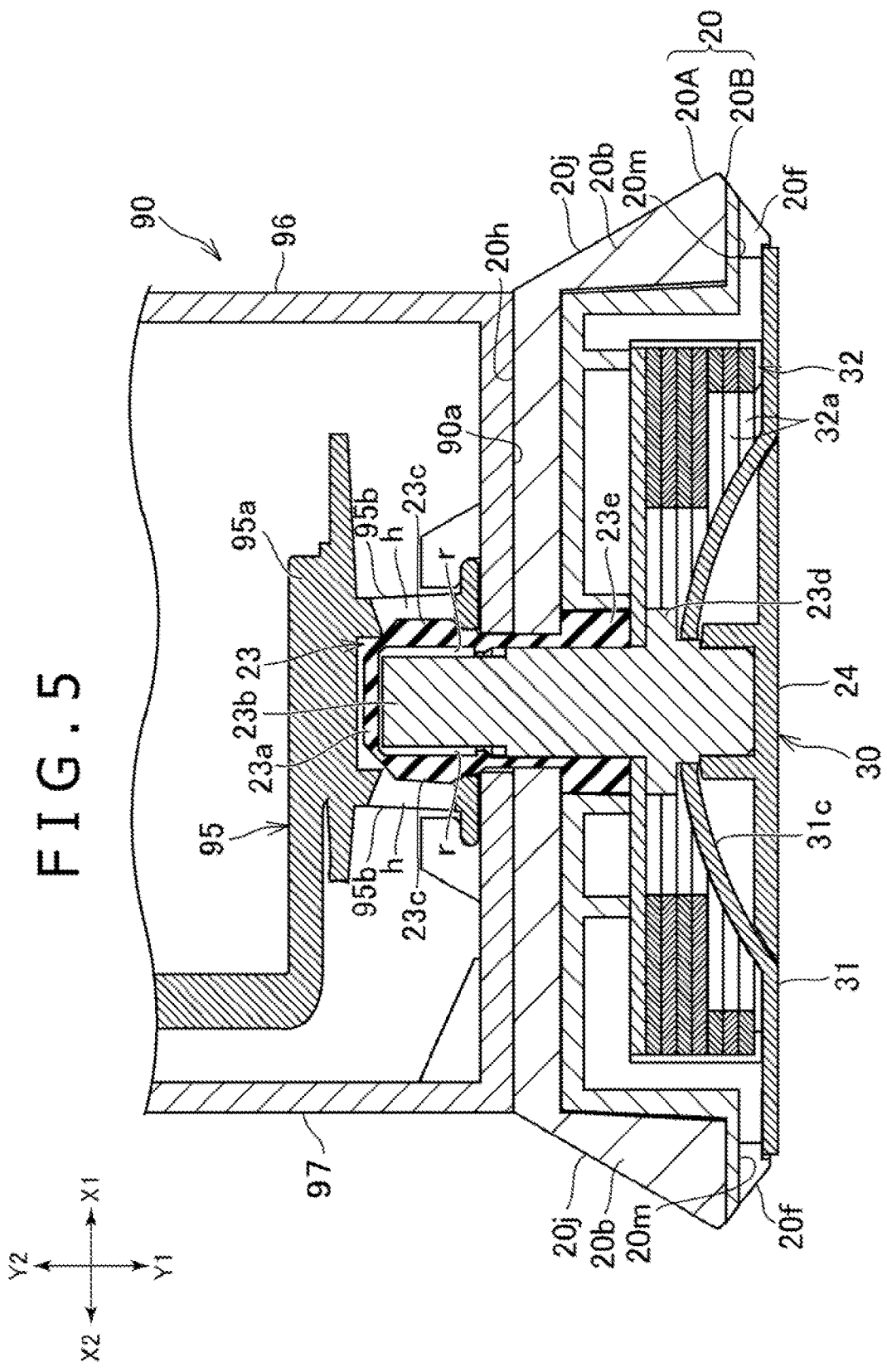
FIG. 5 is a cross-sectional view of the stand and the electronic equipment with the stand attached to the electronic equipment, illustrating the cross section obtained by cutting the stand along line V-V in FIG. 3.
Figure 6:
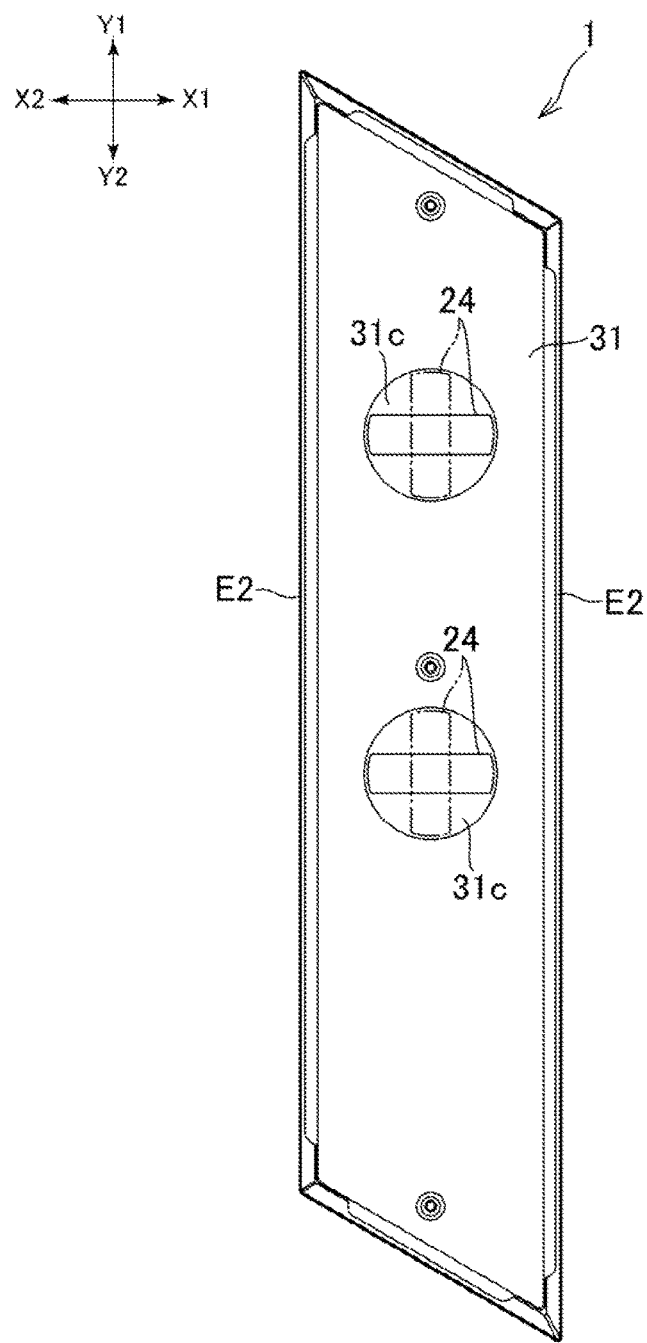
FIG. 6 is a bottom view of the stand.

A description will be given below of an embodiment of the present disclosure with reference to the accompanying drawings. FIG. 1 is a perspective view of a stand 1 and electronic equipment 90 according to an embodiment of the present disclosure. FIG. 1 illustrates the stand 1 and the electronic equipment 90 installed in portrait orientation that are separated from each other. FIG. 2 is a perspective view of the electronic equipment 90. In FIG. 2, the electronic equipment 90 is installed in landscape orientation. FIG. 3 is a plan view of the stand 1. FIG. 4 is a cross-sectional view along line IV-IV in FIG. 3. FIG. 5 is a cross-sectional view of the stand 1 and the electronic equipment 90 with the stand 1 attached to the electronic equipment 90. FIG. 5 illustrates the cross section obtained by cutting the stand 1 along line V-V in FIG. 3. FIG. 6 is a bottom view of the stand 1. In the description given below, "X1" and "X2" illustrated in FIG. 1 are leftward and rightward, respectively, "Y1" and "Y2" are forward and backward, respectively, and "Z1" and "Z2" are upward and downward, respectively.

The stand 1 is used to support electronic equipment in an upright position. The electronic equipment is, for example, a game console, audio visual equipment, personal computer, display device and so on. The electronic equipment 90 illustrated in FIG. 2 is a piece of entertainment equipment that serves as a game console or an audio visual equipment. The electronic equipment 90 outputs movie data generated as a result of execution of a game program or video and audio data obtained from a network or a storage media such as optical disc to a display device such as a television. An insertion port 92 and a connector 93 are provided on a front face 90b of the electronic equipment 90. An optical disc is inserted through the insertion port 92. A controller or other device is connected by the connector 93. A power button 94b and an eject button 94a are also provided on the front face 90b. The eject button 94a is used to eject the optical disc.

The electronic equipment 90 incorporates a cooling fan adapted to cool integrated circuits such as CPU and power circuits. A ventilation section is provided on the outer face of the electronic equipment 90. A plurality of ventilation holes are formed in the ventilation section. In the example described here, an intake section 91 is provided on the outer face of the electronic equipment 90 as a ventilation section illustrated in FIG. 2. The intake section 91 allows the electronic equipment 90 to suck in air. A plurality of intake holes h are formed in the intake section 91. The electronic equipment 90 sucks in outside air through the intake section 91 by driving the cooling fan. The electronic equipment 90 has the intake section 91 on each of left and right side faces 90a. It should be noted that exhaust sections and exhaust holes may be formed as ventilation sections and ventilation holes in place of the intake section 91 and the intake holes h to allow the electronic equipment 90 to discharge air.

As illustrated in FIG. 2, the intake section 91 in the example described here is a groove that extends longitudinally in the side face 90a of the electronic equipment 90. The groove is formed approximately at the vertical center of the side face 90a. The plurality of intake holes h are formed in the inner face of the groove in such a manner as to be arranged side by side in the direction of extension of the groove. The inner face of the groove includes three faces. That is, the inner face of the groove includes first to third faces. The first and second faces are connected respectively to the edges of the groove and are opposed to each other in the direction of width of the groove. The third face connects the first and second faces. The first and second faces are vertically opposed to each other when the electronic equipment 90 is arranged in the orientation illustrated in FIG. 2 (landscape orientation which will be described later). The third face faces sideways when the electronic equipment 90 is arranged in landscape orientation. The intake holes h in the example of FIG. 2 are formed on the first and second faces. It should be noted that the intake holes h may be formed on the third face or only on either of the first and second faces.

The electronic equipment 90 in the example described here has a frame 95, an upper cover 96, and a lower cover 97 as illustrated in FIG. 5 (the vertical direction in this description is that when the electronic equipment 90 is arranged in landscape orientation). The upper cover 96 covers the upper side of the frame 95. The lower cover 97 covers the lower side of the frame 95. The frame 95 has a side wall portion 95a and two overhanging portions 95b. The overhanging portions 95b spread sideways (the term "sideways" in this description means rightward and leftward when the electronic equipment 90 is arranged in landscape orientation). The above groove is made up of the side wall portion 95a and the overhanging portions 95b. The intake holes h are formed in the overhanging portions 95b. The plurality of intake holes h are arranged side by side in the direction of extension of the overhanging portions 95b. Each of the intake holes h has a width (width slightly smaller than the amount by which the overhanging portion 95b overhangs) correspond to the amount by which one of the overhanging portions 95b overhangs (i.e., the depth of the groove). The width of each of the intake holes h in the direction of extension of the overhanging portions 95b is smaller than the width thereof in the direction orthogonal thereto (amount by which the overhanging portion 95b overhangs). The two adjacent intake holes h are partitioned by a wall portion 95c (refer to FIG. 1) formed therebetween.

The electronic equipment 90 can be installed in one of two orientations, one in which the electronic equipment 90 is laid on its bottom face (orientation illustrated in FIG. 2 which will be hereinafter referred to as landscape orientation) and the other in which the electronic equipment 90 is laid on the side face 90a thereof (orientation illustrated in FIG. 1 which will be hereinafter referred to as portrait orientation). The stand 1 is attached to the side face 90a of the electronic equipment 90 and supports the electronic equipment 90 in portrait orientation as illustrated in FIG. 1. The stand 1 has a shape correspond to the side face 90a of the electronic equipment 90. The side face of the electronic equipment 90 in the example described here is approximately parallelogrammic. The stand 1 is approximately parallelogrammic as seen in plan view.

The stand 1 has an attachment face (upper face) 20h opposed to the side face 90a of the electronic equipment 90 as illustrated in FIG. 1. In the example described here, the side face 90a and the attachment face 20h are both flat. When the stand 1 is attached to the side face 90a of the electronic equipment 90, the attachment face 20h is in contact with the side face 90a. It should be noted that a clearance may be provided between the side face 90a and the attachment face 20h. A first ventilation port E1 is formed in the attachment face 20h. The first ventilation port E1 is opposed to the intake section 91 when the stand 1 is attached to the electronic equipment 90. The first ventilation port E1 in the example described here extends longitudinally along the intake section 91. In the example described here, the longitudinal width of the stand 1 is larger than the lateral width thereof. This makes it easy to secure the length of the first ventilation port E1. The length (longitudinal width) of the first ventilation port E1 is correspond to the length of the intake section 91. Further, the width (lateral width) of the first ventilation port E1 is correspond to the width of the intake section 91. That is, the size of the first ventilation port E1 is correspond to the intake section 91 of the electronic equipment 90. The size of the first ventilation port E1 is not limited thereto. Instead, for example, the width (lateral width) of the first ventilation port E1 may be larger than that of the intake section 91. Alternatively, the length (longitudinal width) of the first ventilation port E1 may be smaller than that of the intake section 91.

The stand 1 has a second ventilation port E2 at a position different from the attachment face 20h. Further, the stand 1 incorporates air channels S adapted to connect the first and second ventilation ports E1 and E2 (refer to FIG. 4). This allows the electronic equipment 90 to suck in air through the second and first ventilation ports E2 and E1. As a result, it is possible to minimize the reduction in ventilation efficiency by attaching the stand 1 to the side face 90a of the electronic equipment 90. It should be noted that if an exhaust section and exhaust holes are formed in the electronic equipment 90 respectively as an intake section and intake holes, the electronic equipment 90 discharges air through the first and second ventilation ports E1 and E2 of the stand 1.

The stand 1 has an outer perimeter face that surrounds the attachment face 20h as seen in plan view of the stand 1 and hangs down from the edge of the attachment face 20h. The term "outer perimeter face" here refers to a face that includes a front face 20k (refer to FIG. 3), left and right side faces 20j (refer to FIG. 3), and a back face. As illustrated in FIG. 4, the second ventilation port E2 is provided on the lower side of the lower edge of the outer perimeter face. In other words, the stand 1 has a member (cover 20 in this description which will be described later) having an outer perimeter portion 20b that makes up the outer perimeter face of the stand 1, and the second ventilation port E2 is provided on the lower side of a lower face 20m of the outer perimeter portion 20b. The cover 20 is supported in such a manner that the outer perimeter portion 20b thereof is located upwardly apart from the lower face of the stand 1. The cover 20 is supported by a base 30 which will be described later. As described above, it is possible to make the second ventilation port E2 inconspicuous by providing the second ventilation port E2 on the lower side of the outer perimeter portion 20b. Further, when the stand 1 is placed on an installation surface such as floor, the second ventilation port E2 is open in the direction parallel to the installation surface. As a result, the excellent intake efficiency is secured. It should be noted that the position of the second ventilation port E2 is not limited thereto. For example, a hole may be formed in the outer perimeter portion 20b that penetrates the same portion 20b, and this hole may serve as the second ventilation port E2.

The second ventilation port E2 is located in the direction orthogonal to the direction of extension of the first ventilation port E1 and provided parallel to the first ventilation port E1. The first ventilation port E1 in the example described here extends longitudinally. Therefore, the second ventilation port E2 is located to the right and/or left of the first ventilation port E1. In the example described here, the second ventilation ports E2 are provided, one to the right and another to the left, of the first ventilation port E1, as illustrated in FIG. 4. The two second ventilation ports E2 are located on the opposite sides to each other with the first ventilation port E1 sandwiched therebetween. Each of the second ventilation ports E2 is arranged parallel to the first ventilation port E1. The two second ventilation ports E2 are provided on the lower sides of the lower edges of the left and right side faces 20j of the stand 1, respectively. When the stand 1 is placed on an installation surface such as floor, the two second ventilation ports E2 are open to the right and left, respectively. Each of the second ventilation ports E2 has a longitudinal length correspond to the first ventilation port E1. That is, each of the second ventilation ports E2 has a length roughly equal to that of the first ventilation port E1.

Thus, because the stand 1 has the two second ventilation ports E2, it is possible to achieve excellent intake efficiency. It should be noted that the stand 1 is approximately parallelogrammic as described above. One of the two second ventilation ports E2 is located on the front and to the left of the first ventilation port E1 to suit the external form of the stand 1, and the other second ventilation port E2 is located on the back and to the right of the first ventilation port E1.

The stand 1 incorporates the two air channels S as illustrated in FIG. 4. One of the air channels S extends to the right from the first ventilation port E1 and connects to the second ventilation port E2 on the right. The other air channel S extends to the left from the first ventilation port E1 and connects to the second ventilation port E2 on the left. It should be noted that the second ventilation port E2 may be provided on the lower side of the lower edge of the front face 20k of the stand 1 or on the lower side of the lower edge of the back face of the stand 1. That is, the second ventilation port E2 may be provided along the entire circumference of the stand 1.

The stand 1 has a lower face 31b, a face on the opposite side of the attachment face 20h as illustrated in FIG. 4. The stand 1 has a base plate 31 as a member making up the lower face 31b. The second ventilation ports E2 are formed between left and right edges 31a of the base plate 31 and lower edges 20n of the side faces 20j. The left and right edges 31a of the base plate 31 are located more inward than the lower edges 20n of the left and right side faces 20j. This makes the second ventilation ports E2 inconspicuous in a more effective manner. It should be noted that the side faces 20j of the stand 1 are sloped in such a manner that the lateral width of the stand 1 increases downward. This makes it possible to provide a larger width of the base plate 31.

The stand 1 has the base 30 as illustrated in FIG. 4. The base 30 has the base plate 31 described above and a plate 32a that is arranged on top of the base plate 31. The base 30 in this example has the plurality of plates 32a. The plurality of plates 32a are arranged one on top of the other and make up, as a whole, an approximately rectangular parallelepiped block 32. The plates 31 and 32a are formed, for example, with a metal. As a result, the plates 31 and 32a serve as weights, thus providing improved supporting stability of the electronic equipment 90. It should be noted that the plates 31 and 32a may be made of a resin.

The stand 1 has the cover 20 that includes the attachment face 20h as illustrated in FIG. 4. The above first ventilation port E1 is formed in the cover 20. The cover 20 is arranged in such a manner as to cover the base 30 and is attached to the base 30. The cover 20 has an upper face portion 20a and the outer perimeter portion 20b. The upper face portion 20a covers the upper side of the block 32. The outer perimeter portion 20b surrounds the outer perimeter of the block 32. A clearance is formed between the cover 20 and the block 32 and between the cover 20 and the base plate 31. These clearances serve as the air channels S. It is possible to form the air channels S inside the stand 1 relatively easily by using the cover 20 and the base 30.

The block 32 is located below the first ventilation port E1. The outer perimeter portion 20b of the cover 20 surrounds the outer perimeter of the block 32. As a result, each of the two air channels S includes channels S1 to S3. The channels S1 and S3 extend horizontally (laterally). The channel S2 extends vertically and connects the channels S1 and S3. The channel S1 is defined by the upper face portion 20a and the upper face of the block 32 and extends to the right or left from the first ventilation port E1. The channel S2 is defined by the side face of the block 32 and the outer perimeter portion 20b and extends vertically. The channel S3 is defined by the lower face 20m of the outer perimeter portion 20b and the base plate 31 and extends to the right or left. The lateral width of the base plate 31 is larger than those of the plates 32a. The channel S3 is formed between the part of the base plate 31 protruding from the plates 32a and the lower face 20m of the outer perimeter portion 20b.

Thus, because the vertically extending channel S2 is provided between the channels S1 and S3, it is possible to reduce the entry of dust and other contaminants. Further, the first ventilation port E1 is formed in the shape of a groove, with the channel S1 being open toward the side face of the first ventilation port E1. This makes the channel S1 inconspicuous.

The cover 20 in the example described here has an exterior member 20A and a lower side member 20B as illustrated in FIG. 4. The lower side member 20B is attached to the lower side of the exterior member 20A. The exterior member 20A and the lower side member 20B differ in material and color. A plurality of ribs 20c are formed on the lower side member 20B. The ribs 20c hang down toward the plate 32a. The plurality of ribs 20c are arranged side by side in the direction of extension of the first ventilation port E1 (longitudinally in this example) (refer to FIG. 3). The ribs 20c are in contact with the upper face of the block 32. As a result, the clearances between the cover 20 and the block 32, i.e., the air channels S, are defined.

Holes 20d and 20e are formed respectively in the exterior member 20A and the lower side member 20B to define the first ventilation port E1. The holes 20d and 20e are identically sized (have the same length and width). The ribs 20c extend laterally from the edge of the hole 20e that is formed in the lower side member 20B. The direction of air flow is defined by the ribs 20c. The stand 1 is approximately parallelogrammic to suit the shape of the side face 90a of the electronic equipment 90. The ribs 20c extend diagonally relative to the lateral direction to suit the front and back edges of the stand 1 (refer to FIG. 3).

The lower side member 20B has a bottom portion 20g that is located on the bottom of the hole 20e and extends longitudinally as illustrated in FIG. 4. The bottom portion 20g minimizes the block 32 from being exposed through the first ventilation port E1.

A plurality of ribs 20f are formed on the lower face 20m of the outer perimeter portion 20b of the cover 20 as illustrated in FIG. 5. The ribs 20f hang down toward the edge of the base plate 31. The clearance between the cover 20 and the base plate 31 is defined by the ribs 20f.

Attachment sections 23 are provided in the attachment face 20h of the stand 1 to fasten the stand 1 to the side face of the electronic equipment 90. The attachment sections 23 project upward from the attachment face 20h. The attachment sections 23 are attached to the intake section 91 of the electronic equipment 90. The intake section 91 in the example described here is a groove, and the attachment sections 23 fit into the intake section 91. The attachment sections 23 are provided in the first ventilation port E1. This prevents the attachment structure (more specifically, the attachment sections 23) from being exposed when the stand 1 and the electronic equipment 90 are assembled together. As a result, it is possible to minimize the upsizing of the stand 1 and provide a better appearance of the stand 1 and the electronic equipment 90.

Each of the attachment sections 23 has a width smaller than the lengths of the intake section 91 and the first ventilation port E1 in the longitudinal direction (direction of extension of the first ventilation port E1 and the intake section 91). That is, the attachment sections 23 are provided in part of the direction of extension of the first ventilation port E1. This minimizes the reduction in intake efficiency resulting from providing the attachment sections 23 in the first ventilation port E1. The stand 1 has the plurality of attachment sections 23 (two attachment sections 23 in FIG. 1). These attachment sections 23 are arranged apart from each other in the direction of extension of the first ventilation port E1. This provides improved stability in attaching the stand 1 to the electronic equipment 90.

The attachment sections 23 each have a width correspond to the intake section 91 and the first ventilation port E1 in the lateral direction (direction of widths of the first ventilation port E1 and the intake section 91). More specifically, the lateral width of each of the attachment sections 23 is slightly larger than those of the intake section 91 and the first ventilation port E1. The attachment sections 23 are formed in such a manner as to catch on the inner face of the groove, the intake section 91. In more detail, a projection portion 23c (refer to FIG. 1) is formed on each of the left and right side faces of the attachment section 23. The projection portion 23c catches on the intake hole h formed in the intake section 91 as illustrated in FIG. 5. That is, the projection portion 23c fits into the intake hole h formed in the intake section 91 of the electronic equipment 90. As described above, the two adjacent intake holes h are partitioned by the wall portion 95c. The width of the attachment section 23 in the direction of extension of the intake section 91 is correspond to the entire width of the two wall portions 95c in the direction of extension of the intake section 91. Therefore, when the projection portion 23c is caught on the intake hole h, the attachment section 23 does not block the other intake hole h adjacent to the intake hole h on which the projection portion 23c is caught. The projection portion 23c has a shape correspond to the intake hole h. Further, the intake holes h are formed diagonally relative to the lateral direction (refer to FIG. 2), and the projection portions 23c are tilted to suit the intake holes h. The stand 1 is stably attached to the electronic equipment 90 by engaging the attachment section 23 (more precisely, the projection portion 23c) with the intake hole h. Further, the stand 1 can be detached from the electronic equipment 90 by disengaging the attachment section 23 from the intake hole h.

The attachment section 23 has a cap 23a making up the outer face of the attachment section 23 as illustrated in FIG. 5. Each of the projection portions 23c is formed on the cap 23a. The cap 23a is formed with elastic resin such as rubber or plastic. As the cap 23a becomes dented, the attachment section 23 can be fitted into or detached from the intake section 91.

The attachment section 23 has a rocking member 23b that is arranged inside the cap 23a (refer to FIG. 5). The rocking member 23b is formed, for example, with a metal. The rocking member 23b can rotate about a centerline perpendicular to the attachment face 20h as illustrated in FIG. 3. The rocking member 23b rotates between a locked position P1 and an unlocked position P2. The locked position is a position that restricts the side face of the cap 23a (face on which the projection portion 23c is formed) from becoming dented. The unlocked position is a position that permits the side face of the cap 23a to become dented.

A thickness T1 of the rocking member 23b in one of the two directions orthogonal to each other is larger than a thickness T2 of the rocking member 23b in the other direction as illustrated in FIG. 3. When the rocking member 23b is at the unlocked position P2, that is, when the direction of the thickness T2 is aligned with the lateral direction, a space r is formed between the inner side of the side face of the cap 23a and the rocking member 23b (refer to FIG. 5). This permits the side face of the cap 23a to become dented, allowing fitting of the attachment section 23 into the intake section 91 or disengagement of the attachment section 23 from the intake hole h (more specifically, disengagement of the projection portion 23c from the intake hole h) for removal of the attachment section 23 from the intake section 91. On the other hand, when the rocking member 23b is at the locked position P1, that is, when the direction of the thickness T1 is aligned with the lateral direction, the rocking member 23b is in contact with the inner side of the side face of the cap 23a. This restricts the side face of the cap 23a from becoming dented, restricting the disengagement of the attachment section 23 from the intake section 91.

A swelling portion 31c is formed on the bottom face (base plate 31) of the base 30 as illustrated in FIG. 5. The swelling portion 31c swells upward. The rocking member 23b penetrates the swelling portion 31c downward. A thin long knob 24 is attached to the lower edge portion of the rocking member 23b in the direction of radius of the rocking member 23b (refer to FIG. 6). A user can move the rocking member 23b between the locked position P1 and the unlocked position P2 by rotating the knob 24. The rocking member 23b has a flange 23d that is sandwiched between the swelling portion 31c and the uppermost plate 32a. The cap 23a has, at its lower edge, a flange 23e that is sandwiched between the exterior member 20A of the cover 20 and the uppermost plate 32a.

As described above, the stand 1 includes the attachment face 20h, the first ventilation port E1, the second ventilation ports E2, and the air channels S. The attachment face 20h is opposed to the outer face of the electronic equipment 90. The first ventilation port E1 is formed on the attachment face 20h and opposed to the intake section 91 of the electronic equipment 90. The second ventilation ports E2 are formed at positions different from the attachment face 20h. The air channels S are formed inside the stand 1 and connect the first and second ventilation ports E1 and E2. This minimizes the reduction in ventilation efficiency resulting from attaching the stand 1.

It should be understood by those skilled in the art that various modifications, combinations, sub-combinations and alterations may occur depending on design requirements and other factors insofar as they are within the scope of the appended claims or the equivalents thereof.

For example, the stand 1 may be applied to electronic equipment not including any cooling fan.

Further, the stand 1 may not have the block 32 that serves as a weight.

Still further, the stand 1 may be applied to electronic equipment whose intake section 91 is not in the shape of a groove. In this case, it is not typically necessary to provide the attachment sections 23 on the attachment face 20h.

The attachment sections 23 may not be provided on the stand 1. In this case, for example, the stand 1 may be formed to hold the front face 90b or the back face of the electronic equipment 90.

An exhaust section may be formed as a ventilation section on each of the side faces 90a of the electronic equipment 90 in place of the intake section 91. In this case, exhaust holes are formed in the exhaust section to discharge air by driving a cooling fan.

A ventilation section may be provided on the outer face (e.g., side face) of the electronic equipment 90. The ventilation section includes a plurality of ventilation holes that are arranged apart from each other in two orthogonal directions. In this case, an attachment section may be provided on the stand 1. The attachment section fits into and catches on the ventilation holes.

The present disclosure contains subject matter related to that disclosed in Japanese Priority Patent Application JP 2013-121341 filed in the Japan Patent Office on Jun. 7, 2013, the entire content of which is hereby incorporated by reference.

What is claimed is:

1. A stand attachable to and detachable from an outer face of electronic equipment to support the electronic equipment, the stand comprising:
    a base being longer in a longitudinal direction as compared with a lateral direction;
    a cover member extending over the base, the cover member including an attachment face opposed to the outer face of the electronic equipment on which a ventilation section is provided and at least one side face extending from the attachment face toward the base;
    a first ventilation port formed through the attachment face and opposed to, and exchanging flowing air with the ventilation section of the electronic equipment, the first ventilation port being elongate and extending in the longitudinal direction;
    a second ventilation port extending in the longitudinal direction parallel to the first ventilation port the second ventilation port being formed at a slot between the base and the cover, the slot being defined via the at least one side face extending from the attachment face toward, but stopping short of, the base;
    an air channel formed inside the stand to connect the first and second ventilation ports; and
    an attachment section attached to the ventilation section of the electronic equipment to fasten the stand to the electronic equipment.

2. The stand of claim 1, wherein
    the ventilation section of the electronic equipment is a groove that has an inner face with ventilation holes formed therein and extends in one direction, and
    the attachment section is formed to fit into the groove, the ventilation section of the electronic equipment.

3. The stand of claim 2, wherein
    the groove, the ventilation section of the electronic equipment, has, on its inner face, two faces opposed to each other in the direction of width of the groove, and ventilation holes are formed at least on one of the two faces, and
    the attachment section is formed in such a manner as to catch on the ventilation hole of the electronic equipment.

4. The stand of claim 2, wherein the first ventilation port is formed in such a manner as to extend along the ventilation section of the electronic equipment.

5. The stand of claim 1 wherein:
    the cover includes an outer perimeter face that surrounds an outer perimeter of the attachment face, including the at least one side face,
    the at least one side face hangs down from an edge of the attachment face, and
    the second ventilation port is provided on a lower side of a lower edge of the outer perimeter face.

6. The stand of claim 1 wherein: the base includes a lower face, which is opposite to the attachment face; and the air channel is formed between the cover and the base.

* * * * *